US006084245A

United States Patent [19]

Hsu et al.

[11] Patent Number: 6,084,245

[45] Date of Patent: Jul. 4, 2000

[54] FIELD EMITTER CELL AND ARRAY WITH VERTICAL THIN-FILM-EDGE EMITTER

[75] Inventors: David S. Y. Hsu; Henry F. Gray, both of Alexandria, Va.

[73] Assignee: The United States of America as represented by the Secretary of the Navy, Washington, D.C.

[21] Appl. No.: 09/045,853

[22] Filed: Mar. 23, 1998

[51] Int. Cl.[7] ....... H01L 29/06

[52] U.S. Cl. ....... 257/10; 313/309; 313/310; 313/336; 313/351

[58] Field of Search ....... 257/10, 11; 313/356, 313/309, 310, 336, 351, 355

[56] References Cited

U.S. PATENT DOCUMENTS

| | | | |
|---|---|---|---|
| 5,214,347 | 5/1993 | Gray . | |
| 5,246,879 | 9/1993 | Hsu et al. . | |
| 5,266,155 | 11/1993 | Gray . | |
| 5,382,185 | 1/1995 | Gray et al. . | |
| 5,430,348 | 7/1995 | Kane et al. | 313/309 |
| 5,457,355 | 10/1995 | Fleming et al. | 313/336 |
| 5,584,740 | 12/1996 | Hsue et al. | 445/49 |
| 5,587,588 | 12/1996 | Kim | 257/10 |
| 5,769,679 | 6/1998 | Park et al. | 445/50 |
| 5,780,318 | 7/1998 | Hirano et al. | 438/20 |
| 5,864,147 | 1/1999 | Konuma | 257/10 |
| 5,910,701 | 6/1999 | Takemura | 313/309 |

OTHER PUBLICATIONS

Hsu et al., *Appl. Phys. Lett.* 63(2), Jul. 12, 1993, 158–161.
Chou et al., *Science*, vol. 272, Apr. 5, 1997, 85–87.
Fleming, J.G., et al., "Fabrication and Testing of Vertical Metal Edge Emitters with Well Defined Gate to Emitter Sparation," *J. Vac. Sci. Technol.*, B14 (3), May/Jun. 1996, pp. 1958–1962.

*Primary Examiner*—Jerome Jackson, Jr.
*Assistant Examiner*—Bradley W. Baumeister
*Attorney, Agent, or Firm*—Barry A. Edelberg; John J. Karasek

[57] ABSTRACT

A field emitter cell includes a thin film edge emitter normal to a gate layer. The field emitter is a multilayer structure including a low work function material sandwiched between two protective layers. The field emitter may be fabricated from a composite starting structure including a conductive substrate layer, an insulation layer, a standoff layer and a gate layer, with a perforation extending from the gate layer into the substrate layer. The emitter material is conformally deposited by chemical beam deposition along the sidewalls of the perforation. Alternatively, the starting material may be a conductive substrate having a protrusion thereon. The emitter layer, standoff layer, insulation layer, and gate layer are sequentially deposited, and the unwanted portions of each are preferentially removed to provide the desired structure.

29 Claims, 9 Drawing Sheets

FIG. 4a
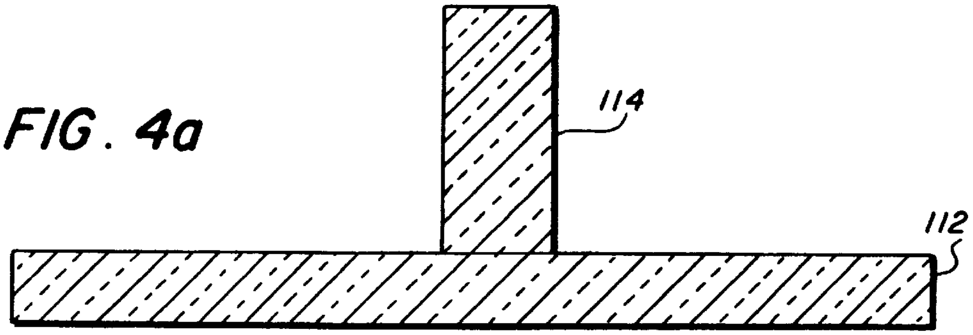
FIG. 4b
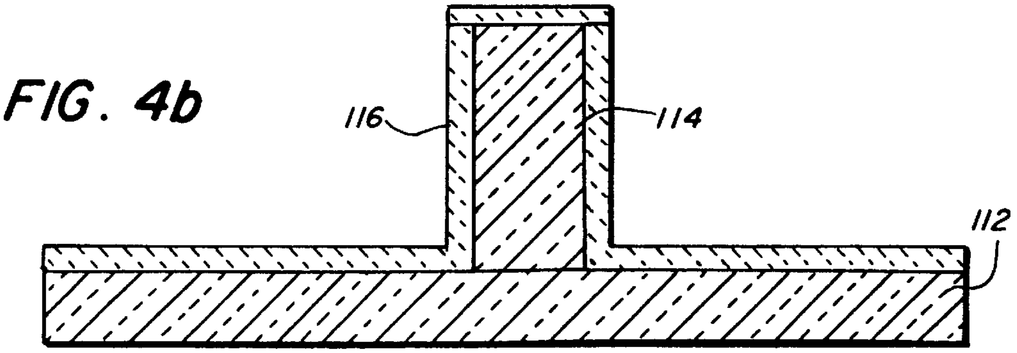
FIG. 4c
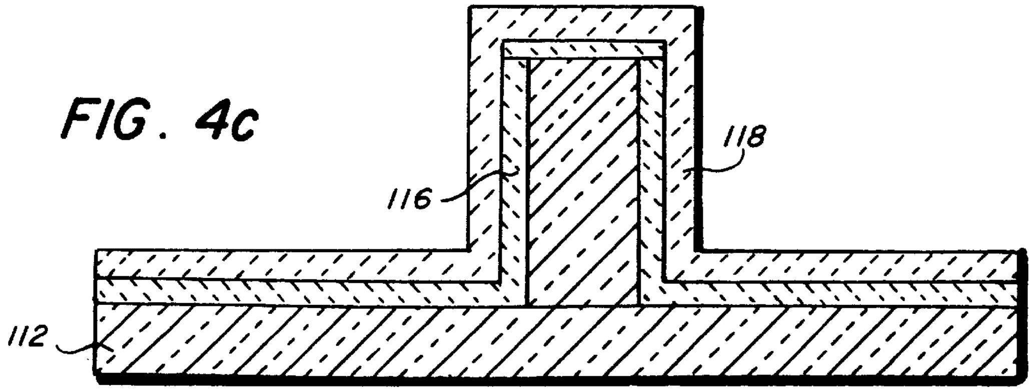
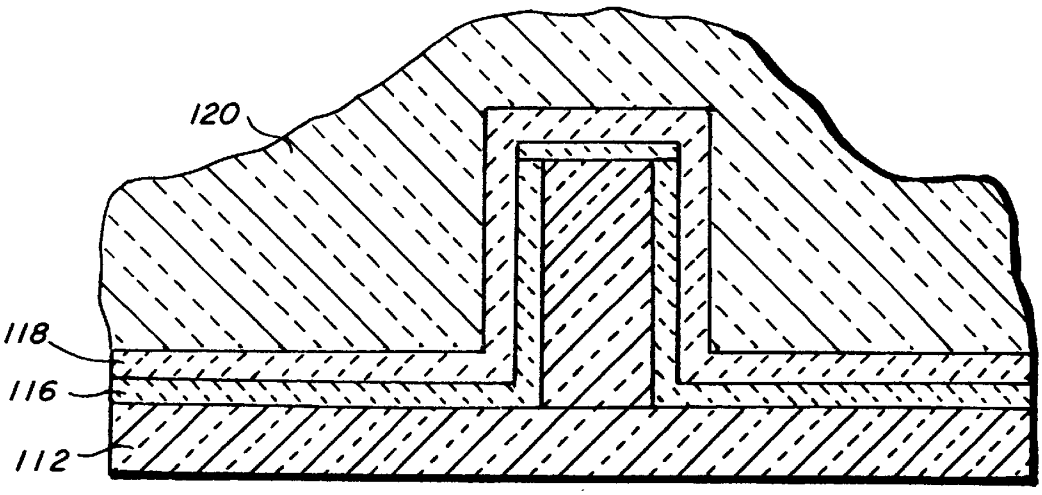
FIG. 4d

FIELD EMITTER CELL AND ARRAY WITH VERTICAL THIN-FILM-EDGE EMITTER

BACKGROUND OF THE INVENTION

1. Field of the Invention

The present invention relates generally to field emitter cells and arrays and more specifically to thin-film-edge emitter cells and arrays.

2. Description of the Background Art

Very small localized vacuum electron sources which emit sufficiently high currents for practical applications are difficult to fabricate. This is particularly true when the sources are required to operate at reasonably low voltages. Presently available thermionic sources do not emit high current densities, but rather result in small currents being generated from small areas. In addition, thermionic sources must be heated, requiring special heating circuits and power supplies. Photo emitters have similar problems with regard to low currents and current densities.

Field emitter arrays (FEAs) are naturally small structures which provide reasonably high current densities at low voltages. FEAs typically comprise an array of conical, pyramidal or cusp-shaped point, edge or wedge-shaped vertical structures which are electrically insulated from a positively charged extraction gate and which produce an electron beam that travels through an associated opening in the charged gate.

The classical field emitter includes a sharp point at the tip of the vertical structure and opposite an extraction electrode. In order to generate electrons which are not collected at the extraction electrode, but can be manipulated and collected somewhere else, an aperture is created in the extraction electrode which aperture is significantly larger (e.g. two orders of magnitude) than the radius of curvature of the field emitter. Thus, the extraction electrode is a flat horizontal surface containing an extraction electrode aperture for the field emitter. The field emitter is centered horizontally in the extraction electrode aperture and does not touch the extraction electrode, although the vertical direction of the field emitter is perpendicular to the horizontal plane of the extraction electrode. The positive charges on the edge of the extraction electrode aperture surround the field emitter symmetrically so that the electric field produced between the field emitter and the extraction electrode causes the electrons to be emitted from the field emitter in a direction such that are collected on an electrode (anode) separate and distinct from the extraction electrode. A very small percentage of the electrons are intercepted by the extraction electrode. The smaller the aperture, i.e., the closer the extraction electrode is to the field emitter, the lower the voltage required to generate the electron beam.

It is difficult to create FEAs which have reproducibly small radius-of-curvature field emitter tips of conducting materials or semiconducting materials. Furthermore, it is equally difficult to gate or grid these structures where the gate-to-emitter distance is reasonably small to provide the necessary high electrostatic field at the field emitter tip with reasonably small voltages. The radius of curvature is typically 100–300 angstroms (Å) and the gate-to-emitter distance is typically 0.1–0.5 micrometers ($\mu$m).

Current methods of manufacturing FEAs include wet etching, reactive ion etching, and a variety of field emitter tip deposition techniques. Practical methods generally require the use of lithography which has a number of inherent disadvantages including the high cost of the equipment needed. Furthermore, the high degree of spatial registration required prevents parallel processing, i.e., the fabrication of a very large number of emitters at the same time in a single process.

To a large extent, these prior art problems were overcome by Hsu et al., U.S. Pat. No. 5,584,740 and Gray et al., U.S. Pat. No. 5,382,185, both of which are incorporated herein by reference for all purposes in their entirety. The '740 and '185 patents describe a thin-film-edge emitter cell including a substrate having a protuberance extending therefrom, a conformally deposited insulating layer over the substrate and vertical sidewall of the protuberance, an emitter film conformally deposited upon the insulating layer and the vertical sidewall thereof, and a gate metallization layer parallel to the vertically extending portion of the emitter film. The emitter film extends vertically beyond the protuberance. U.S. Pat. Nos. 5,214,347 and 5,266,155 to Gray, both are which are incorporated-by-reference herein in their entirety for all purposes, describe horizontal thin-film edge field emitters and gated field emitters.

Because of the parallel orientation of the emitter film relative to the gate, the insulating layer between these elements in those patented devices must be sufficiently thin so that, at the emitter tip, the gate generates a field capable of extracting electrons at the tip. The dependence of the gate to tip distance upon insulating film thickness requires a trade off between the reduced susceptibility to pinhole defects and reduced voltage breakdown offered by thicker insulating films and the increased voltage demands caused by the resulting additional gate to tip distance. Additionally, the parallel orientation of the gate layer creates a high capacitance. In turn, this high capacitance increases the RC time constant, reducing frequency response and power efficiency.

SUMMARY OF THE INVENTION

Accordingly, it is an object of this invention to provide an efficient field emitter cell that may be readily and economically fabricated.

It is another object of the present invention to provide a field emitter cell having a low capacitance and good frequency response.

It is a further object of the present invention to provide an efficient, low voltage, low power field emitter cell that can be fabricated in arrays without special measures to assure correct alignment of the gate electrode and the emitter tip.

It is yet another object of the present invention to provide a field emitter cell at the lowest possible cost with the least number of processing steps.

It is a yet further object of the present invention to provide a field emitter cell in which the emitter is protected against oxidation and blunting.

These and additional objects of the invention are accomplished by a field emitter cell having an electrically conductive substrate. An insulating layer extends over the substrate. This insulating layer has at least one perforation through it. The perforation has essentially vertical sidewalls and a bottom defined by the substrate. A conducting layer, having a perforation therein extends over the insulating layer, and serves as a gate electrode. The perforation of the conducting layer is coincident with the perforation in the insulating layer. A thin-film-edge emitter layer extends upward from the perforation, normal to the gate electrode, to a height just above, just below, at, or in between, the horizontal surfaces of the gate electrode.

The field emitter cell of the present invention may be made by various methods using known lithographic, deposition, and etching steps. In one embodiment, the perforations in the insulating layer are made by stamping, or may be already present by virtue of the nature of the selected insulating layer.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIG. 4*a* through FIG. 4*i* show an alternative method of making a field emitter cell according to the present invention.

DESCRIPTION OF THE PREFERRED EMBODIMENTS

Figure 1:
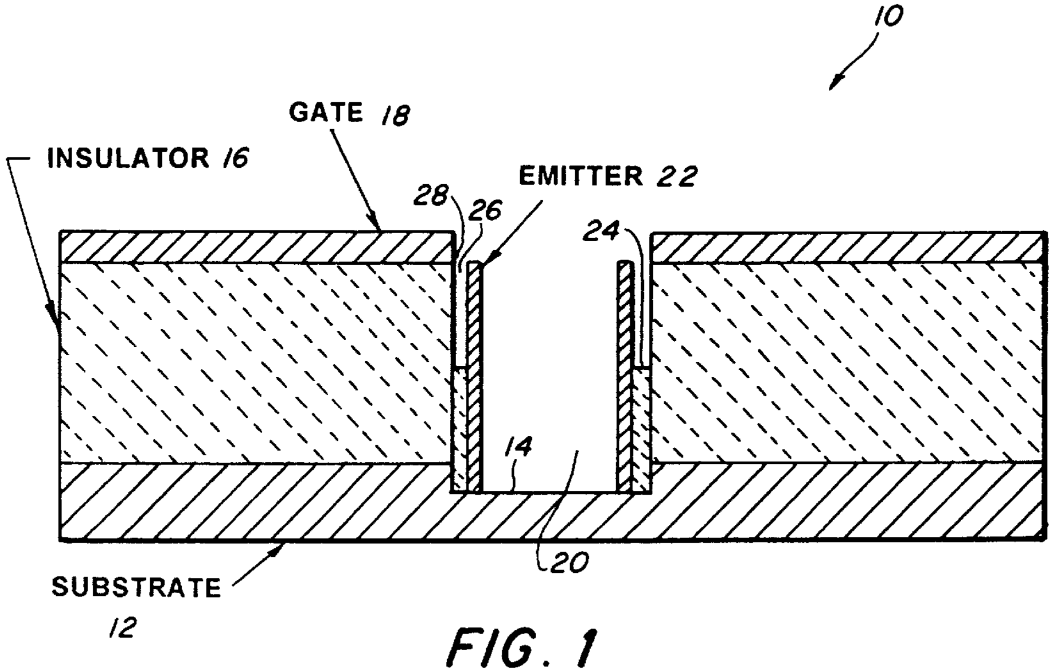
FIG. 1 shows a side view of typical field emitter cell according to the present invention.

The present invention includes a field emitter cell in which the thin-film-edge emitter is essentially perpendicular to the gate layer, insulation layer, and substrate. That unique arrangement maximizes the distance between the gate and substrate, and minimizes the distance between the gate and the emitter, resulting in a large increase in power efficiency and a sharp reduction in the RC constant.

The substrate layer can be a conductor, an n-doped semiconductor, a resistive material, a transistor, or a composite, alloy, or multilayer structure including one or more of these classes of materials. The substrate layer, however, should be capable of conducting electrons. Throughout the present invention and claims, the terms "conductor" and "conducting material" include both normal conductors and superconductors unless otherwise stated. If a resistive layer is used, emission current can be controlled or limited to prevent burnout of the emitter and to provide emission area uniformity as well as a decrease in noise. A resistive material minimizes burnout by causing an IR drop that results in current limiting in the field emitter cell The insulating layer may be any electrically insulating material. Typical materials useful as the insulating layer of the present invention include metal oxides, glass, and organic material (e.g., organic polymers).

The emitter is preferably any low work function material that is protected from ready oxidation. Typically, the emitter is selected from among the same class of materials as is the substrate layer. As with the substrate layer, the emitter layer should be capable of conducting electrons. A preferred conducting material is lithium sandwiched between platinum layers, although other materials can be readily used. Typically materials useful as the emitter include platinum, its compounds and its alloys, ruthenium, its compounds and its alloys, and lithium and its alloys. The emitter, like the substrate, may also be an inhomogeneous composite or a multilayer structure. Typically, when the emitter is an alloy, composite (mixture or inhomogeneous) or multilayer structure, at least one of the materials typically has a low work function. For examples, alloys of Li with Pt and/or Ru are useful as an emitter material in the present invention. Typically, a path for electron conduction should be provided between the substrate and the emitter. If a multilayer structure is used, only one of the layers need to be electron conductive. The other layers can be insulating, semiconducting, or hole conductors. If a resistive material is used for the emitter, the emission current can be controlled to prevent emitter burnout and to provide area uniformity as well as a decrease in noise. A resistive material minimizes burnout by causing an IR drop that results in current limiting in the field emitter cell In one particularly preferred embodiment, the emitter may be a noble metal/low work function material/noble metal sandwich, typically with each layer of the sandwich having a thickness of about 0.005 to about 0.1 microns. For example, Ru/Li/Ru and Pt/Li/Pt sandwiches have provided excellent results. Other noble metals useful as outer layers in an emitter structure for the present invention include Pd, Au, Ir and Os. Non-noble metals, such as W, Mo, Ni, Ti, Cr, and V may also be used as the outer layers in an emitter structure for the present invention. Insulators, and/or semiconductors, may also be used for the outer layers of the emitter multilayer structure, for example, to protect the emitter from oxidation. Useful materials for protective outer layers on the emitter include ceramics, such as AlN, TiAlN, AlTiN, BN, TiN, SiN, SiC, diamond, and diamond-like carbon. In these embodiments, the outer layers can, but do not necessarily, protect the low work function emitter material against oxidation, since only the emitting tip of the low work function emitter material needs to be exposed.

As stated above, the actual emitting material itself may be any low work function material. Typical low work function emitter materials include, and are not limited to, alkali metals such as Li, K, Na, Rb, Cs, alkaline earth metals such as Mg, Ba, Sr, Ca, transition metals such as Y and Zr, and other metals such as Th and U, and alloys or compounds containing such materials.

Typically, the emitter layer of the present invention has sharp tips having a radius of curvature of about 20 nm or less, and more often of about 10 nm or less and most often about 5 nm or less.

The gate layer may be a single layer, multilayer, composite, alloy, or elemental material. The gate should, however, include at least one material that is a conductor, a semiconductor, or a resistive material. A resistive gate layer or a composite including a resistive material minimizes burnout by causing an IR drop that results in current limiting in the field emitter cell. Unlike the emitter and the substrate, the gate layer need not conduct electrons. That is, the gate may be a conductor by virtue of hole rather than electron mobility. The use of a p-doped semiconductor in the gate layer may be particularly advantageous, since it minimizes electrons from emitting from the gate, causing spurious and unregulated emission.

The sidewalls of the perforation in the present invention should form a vertical shell with an open upper end that serves as the upper electron-emitting edge. Typically, these walls extend at an angle of at least about 80° (and more often at an angle of at least 85°) with respect to the substrate and preferably extend at an angle of substantially 90° with respect to the substrate. Because of its superior electrical and mechanical properties, a cylindrical structure is most typical, but is not required for the practice of this invention. Any other shape (e.g, a shape having a square, rectangular, zig-zig, spiral, etc. cross-section) may be used.

The absolute and relative thicknesses of the various layers will depend upon the intended use of the device. The best determination of these parameters for any known application may be determined by routine experimentation combined with knowledge possessed by those having ordinary skill in the art of field emitter cells and arrays. Nevertheless, some additional guidance is offered here. A major advantage of the present invention is that the thicknesses of the various layers and component dimensions, such as emitter height, gate aperture size, and gate-emitter separation, are individually and independently selectable.

In many cases, it is desirable to have a vertical spacer layer extending between the insulator layer and the emitter, extending to somewhat less than the height of the emitter. Mainly, the spacer provides mechanical support for the emitter and determines the distance between the emitter and the gate aperture edge. Any material may be used for the spacer. For example, the spacer layer may be an insulator, a conductor, or a semiconductor. If the spacer layer is an electron-conducting material, it can also serve as an electron transport medium and heat sink to the emitter. If the spacer layer is a resistive material, it can serve as a control mechanism for current flow.

The base and the conductive part of the substrate of the invention may be any thickness. In typically applications, the base and the conductive part of the substrate will each be from about 0.5 $\mu$m to about 1000 $\mu$m, and more often about 0.5 $\mu$m to about 100 $\mu$m. Typically, the insulating layer will have a thickness of about 0.1 $\mu$m to about 10 $\mu$m and more often about 1 $\mu$m to about 10 $\mu$m. The gate layer typically has a thickness of about 0.1 $\mu$m to about 1 $\mu$m. Typically, the spacer has a thickness of about 100 Å to about 1 $\mu$m. More often, the spacer has a thickness of about 100 Å to about 0.5 $\mu$m.

If desired for handling or for a specific application, the substrate/insulator/emitter/gate (with or without spacer layer) may be supported upon a base. If used, the base may be any material, conductor, semiconductor, or insulator, or any combination of these materials.

Also, adhesion layers may be used, if needed, between the insulating layer and the gate layer, between the emitter layer and the spacer layer, between the insulating layer and the spacer layer, and/or between the emitter layer and the substrate, as well as between two layers of a multilayer component. Typical adhesion layers include Ti and TiN. The adhesion layer may be included as a part (i.e., sublayer) of a multilayered substrate, insulating layer, spacer layer, gate layer, and/or emitter layer. When used at the interface between two multilayered component layers, the adhesion layer will be an outer layer of at least one of the two multilayered component layers.

Figure 2:
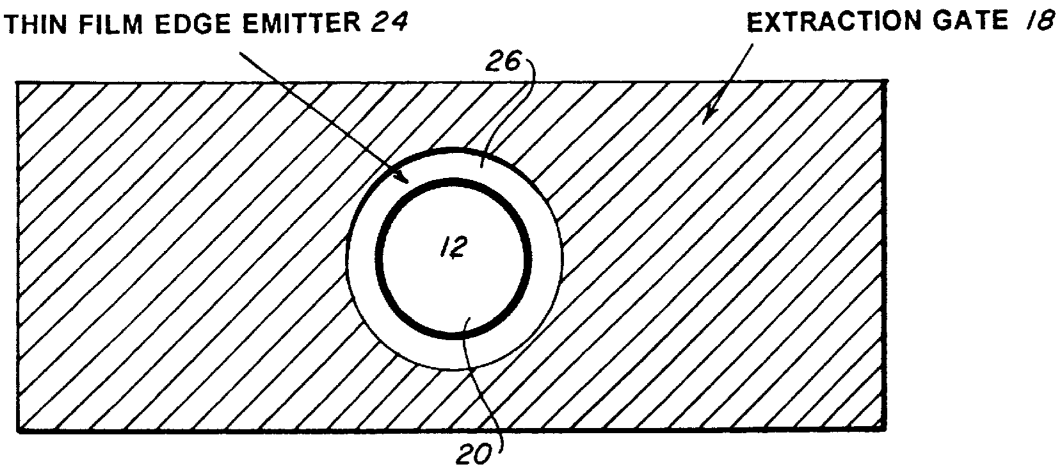
FIG. 2 shows a top view of the field emitter cell shown in FIG. 1.

FIG. 1 shows a side view of typical field emitter cell 10 according to the present invention. Substrate has a depression 14, with essentially vertical sidewall, therein. Insulator layer 16 directly overlays substrate 12. Gate 18, which is either a single layer or a multilayer component, directly overlays insulator layer 16. Both insulator layer 16 and gate 18 have therein a perforation 20, with vertical sides, coincident with depression 14. Substrate 12 therefore defines the bottom of perforation 20. Emitter 22 extends, essentially vertically upward from the bottom of perforation 20 to the vicinity of gate 18 (in this case, to or just below the insulator layer/gate layer interface). Spacer 24 extends vertically between insulator layer 16 and emitter 22. Although not required, depression 14 provide physical support and better electrical contact for emitter 22. A vacuum gap 26 exists between the upper portion of the emitter and insulator layer 16. If desired, insulating layer 16 may be undercut at the upper part of edge 28 where insulator layer 16 defines perforation 20 and interfaces with gate layer 18 (See FIG. 3*g*). Such undercutting further increases the insulation distance between the emitter and the gate, thus reducing the likelihood of shorting along the surface between emitter 22 and gate 18. FIG. 2 shows a top view of the device shown in FIG. 1.

A field emitter cell according to the present invention, or array thereof, may be produced by a variety of methods. In one typical procedure, shown in FIGS. 3*a* through 3*f*, conducting substrate 12, with or without a base (not shown), is provided on at least its upper surface (with respect to any base that may be present) with insulating layer 16 and gate layer 18 overlaying insulating layer 16. The insulating layer may be provided by any means, such as bonding of a preformed insulating layer, CVD deposition, CBD deposition, physical deposition such a evaporation or sputtering, oxidation of the substrate layer, ion-implantation, etching, etc. Likewise, the method of providing the gate layer is not particularly critical to the present invention. Methods such as melt bonding of a preformed layer of conducting material, evaporative deposition, CVD (chemical vapor deposition), CBD (chemical beam deposition), aqueous plating, electroplating, sputter deposition, and ion-implantation may be used.

Figure 3A:
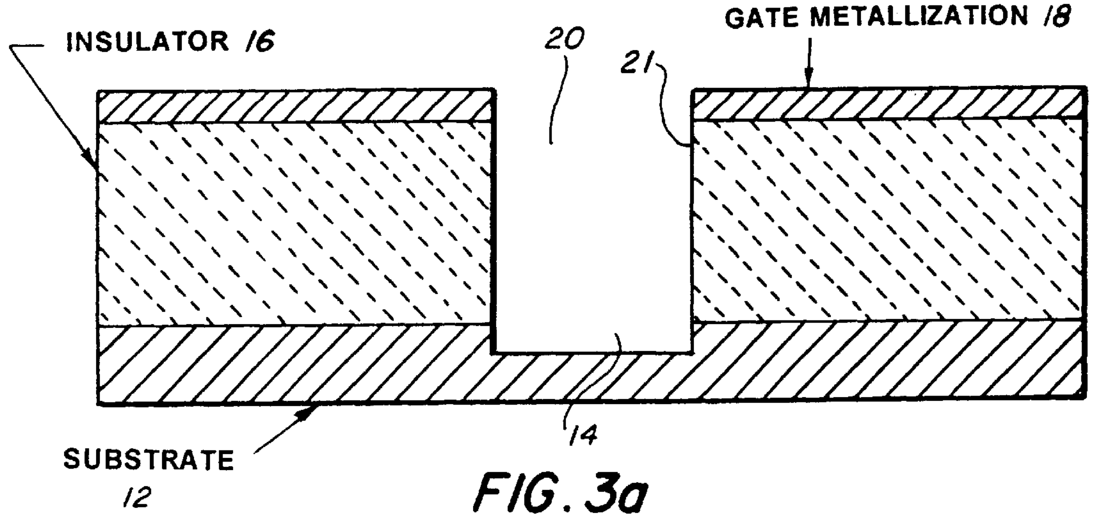
FIG. 3*a* through FIG. 3*g* show one method of making a field emitter cell according to the present invention.

Insulating layer 16 and gate layer 18 of the resulting laminate must then be perforated to provide perforation 20 having essentially vertical sidewalls 21. Perforation 20 forms a well that extends at least to the upper surface of the conducting substrate. A variety of methods may be used to provide the needed perforations (FIG. 3*a*). One particularly useful method is to reactive ion etch (RIE) the laminate through a mask. In one known method, perforations can be make by mechanical stamping, using, for example, the method described by Stephen Chou, *Science,* Vol. 272, Apr. 5, 1996, pages 85 through 87, the entirety of which is incorporated herein by reference. In an alternative method posts, for example of Si, may be provided on the substrate, for example by RIE. Then, an insulator layer is deposited over the post structure and substrate such that insulator thickness is greater than the height of the post. The resulting structure is then planarized, mechanically polished, or chemically-mechanically polished (CMP) to provide a flat upper surface. Selectively etching the back of the insulator leaves a portion of the post protruding above the insulator layer. Then, directional deposition of a gate material over the top of the post and the substrate is performed. The resulting pillar or post may then be preferentially etched to provide a hole, with essentially vertical sidewalls, through the gate layer and insulator layer.

Figure 3B:
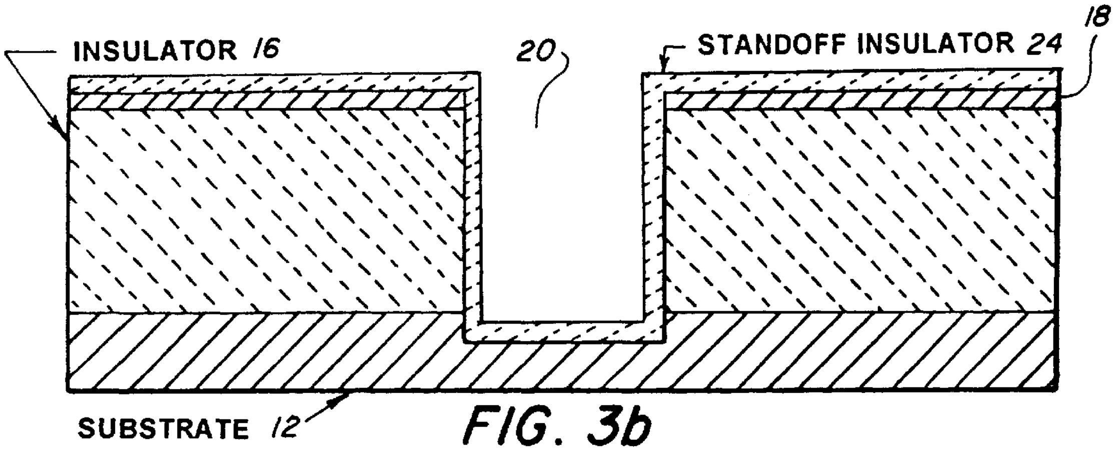
Figure 3C:
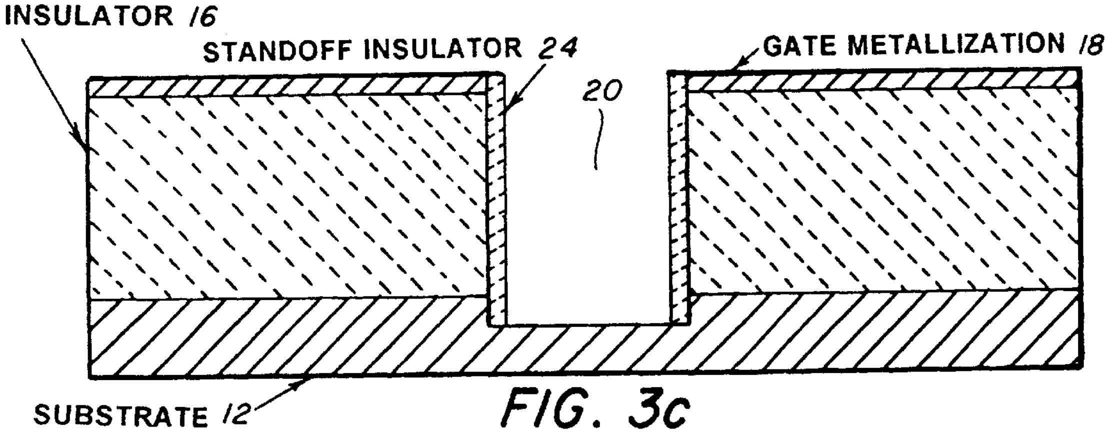

If desired, standoff (or spacer) layer 24 may be deposited or otherwise formed directly over the gate layer 18 and vertical sidewalls 21 of perforation 20 (FIG. 3*b*). The standoff layer may be deposited by any method, such as CVD and CBD. Conformality of the deposition of the standoff is not critical, provided that the thickness of the vertical section of each layer along its vertical sidewall is uniform. While the grain size of the standoff layer is not highly critical, it is more critical in the emitter layer. Removal of the horizontal portion of standoff layer 24 by any available method (e.g., by RIE, sputtering, mechanical polishing or chemical mechanical polishing) provides the structure shown in FIG. 3*c.*

Figure 3D:
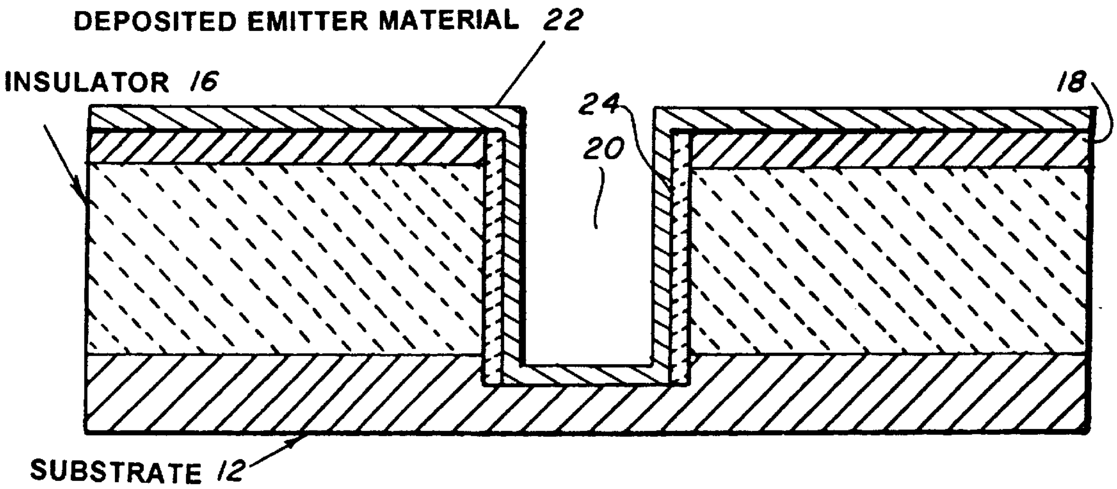

As shown in FIG. 3*d,* emitter layer 22 is deposited, by chemical beam deposition, on the upper surface of gate layer 18 having perforation 20 therein. This deposition also deposits emitter layer 22 upon the vertical sidewalls of perforation 20. Conformal CBD deposition may be done, for example, according to the method of Hsu et al., U.S. Pat. No. 5,246,879, the entirety of which is incorporated herein by references for all purposes. Conformal deposition by CBD according to the teachings of Hsu et al. '879 can readily provide thin conformal layers having fine grain sizes. The deposition need not be conformal, however, if the portion of the vertical section of the emitter layer along the sidewalls has an essentially uniform thickness.

Figure 3E:
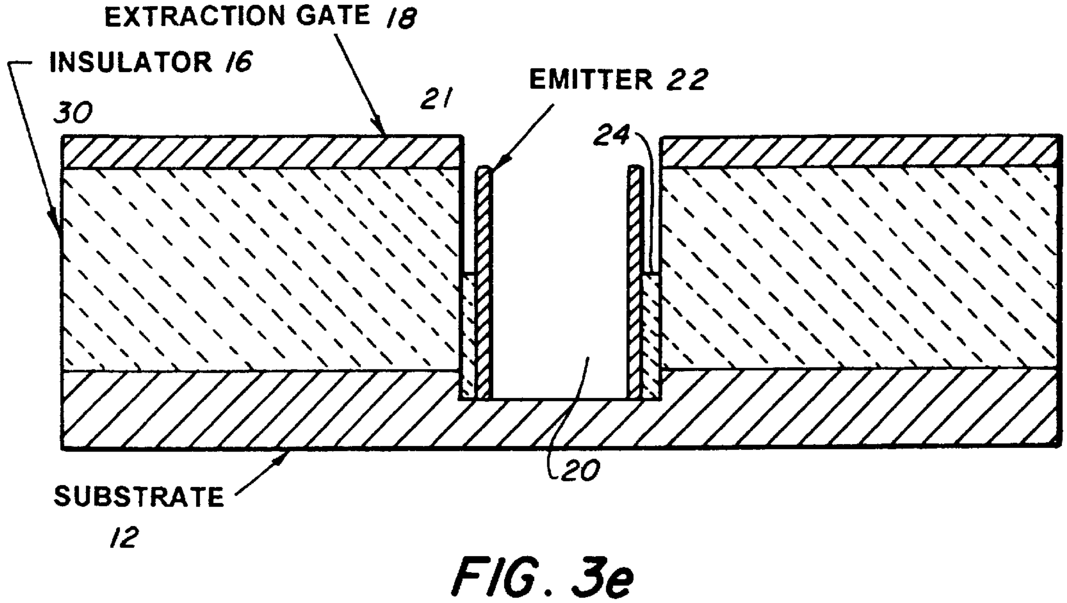

As shown in FIG. 3*e,* emitter layer 22 is then directionally etched to remove at least the horizontal portion overlying gate layer 18. Removing the horizontal portion of the emitter layer 22 by etching or sputtering, rather than by mechanical polishing or CMP, avoids the need to provide a fill within perforation 20 to further support the emitter structure during that and subsequent processes. If desired, a film of diamond, or diamond-like carbon may be formed, by any known means, upon emitter layer 22 to provide a plurality of sharp points 34 for improved electron emission (FIG. 3*g*). Additionally, even without diamond coating, sputtering or etching of the top of the vertical portion of emitter layer 22 inherently provides sharp points 34 that have a small radius of curvature for improved electron emission.

As also shown by FIG. 3*e,* standoff layer 24 is then selectively etched (e.g., by RIE or wet etching) to remove the top portion of the spacer layer over the perforation. A spacer layer extending from the substrate to below the insulator/gate interface 30 results.

Figure 3F:
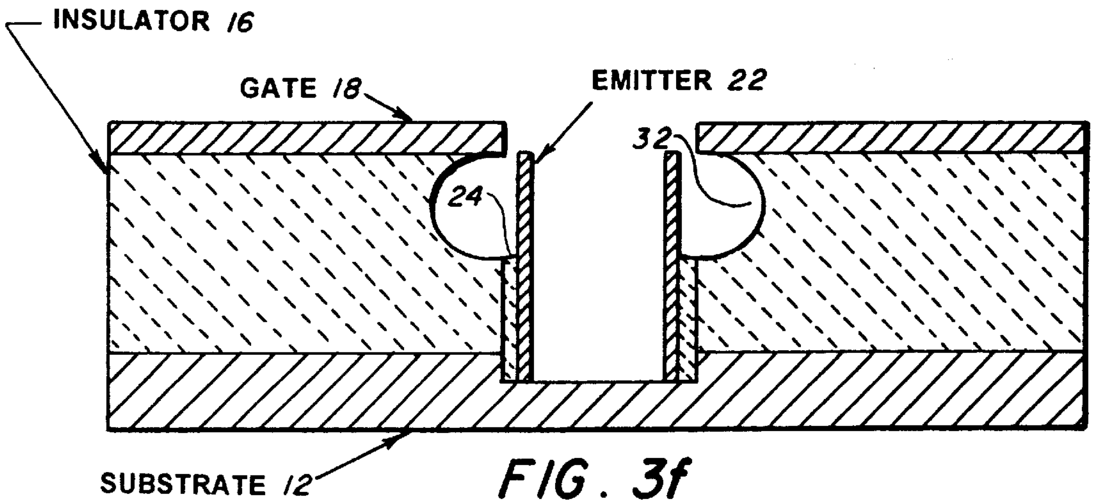
Figure 3G:
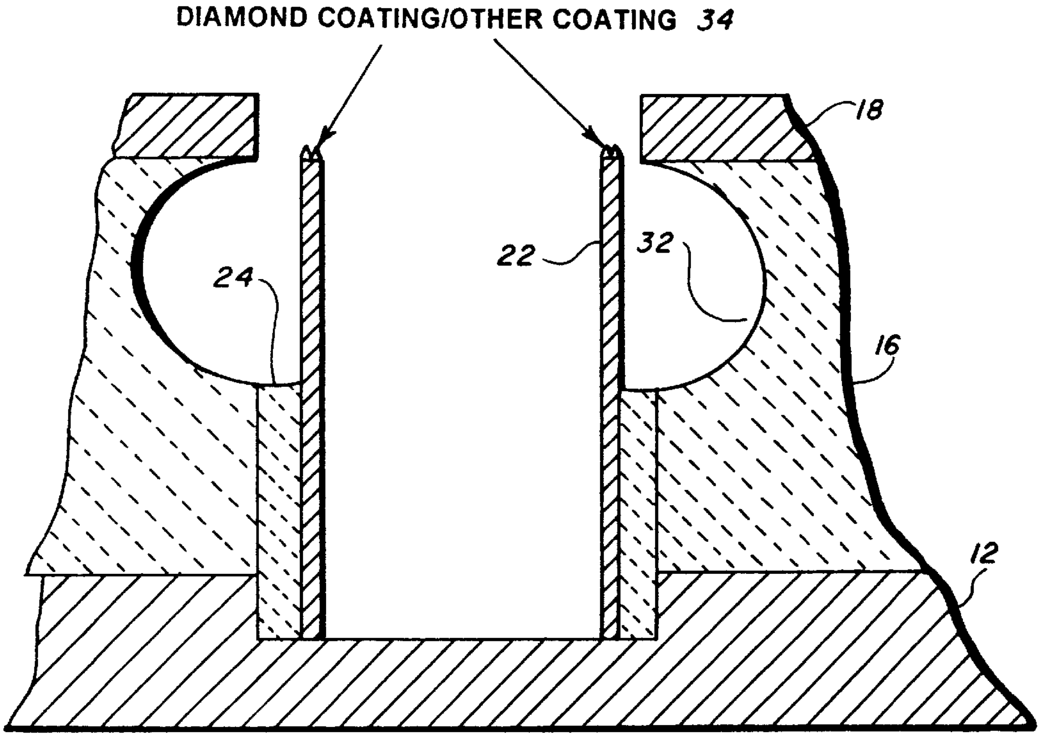

As shown in FIG. 3*f,* undercut 32 may be etched, by known means, at the upper portion of insulating layer 16 and at, above, or below the upper surface of the remaining portion of standoff layer 24.

An advantage of the process shown in FIGS. 3*a* through 3*f* is that the process does not require planarization. Therefore, the entire fabrication process may be performed entirely in a vacuum, without removing the workpiece from the vacuum chamber.

Figure 4E:
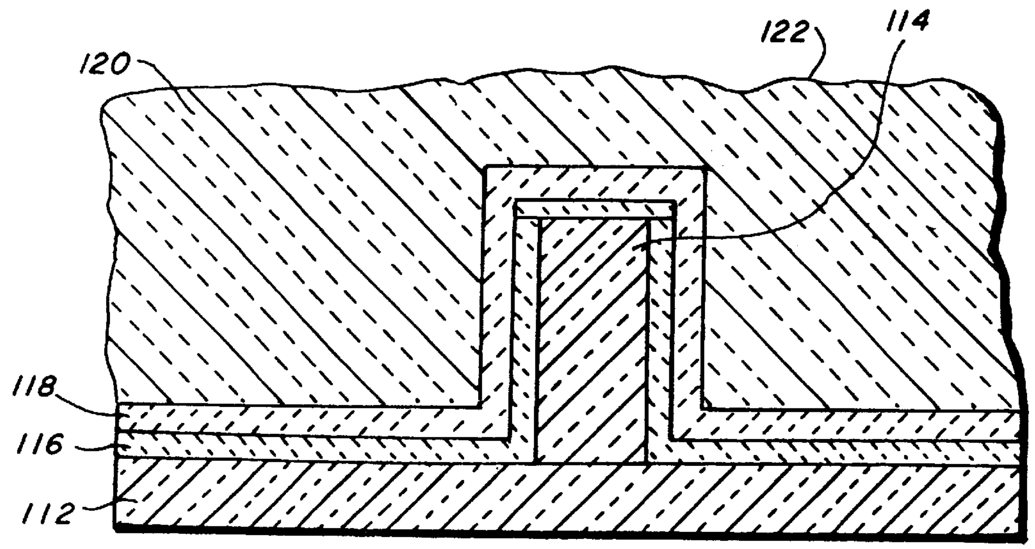

FIGS. 4*a* through 4*j* show an alternative method of making a field emitter cell according to the present invention. As shown in FIG. 4*a,* substrate 112 having protrusion 114 is provided. In FIG. 4*b,* emitter layer 116 is then deposited, by CBD for example, over substrate 112, including protrusion 114. In FIG. 4*c,* standoff layer 118 is then provided over emitter layer 112. Then, as shown in FIG. 4*d,* insulating layer 120 is provided, by any means, over standoff layer 118. The thickness of insulating layer 120 can vary across the structure. As shown in FIG. 4*e,* the insulating layer may have, at all points, a height greater than that of the top of the portion of standoff layer 118 covering protrusion 114.

Figure 4F:
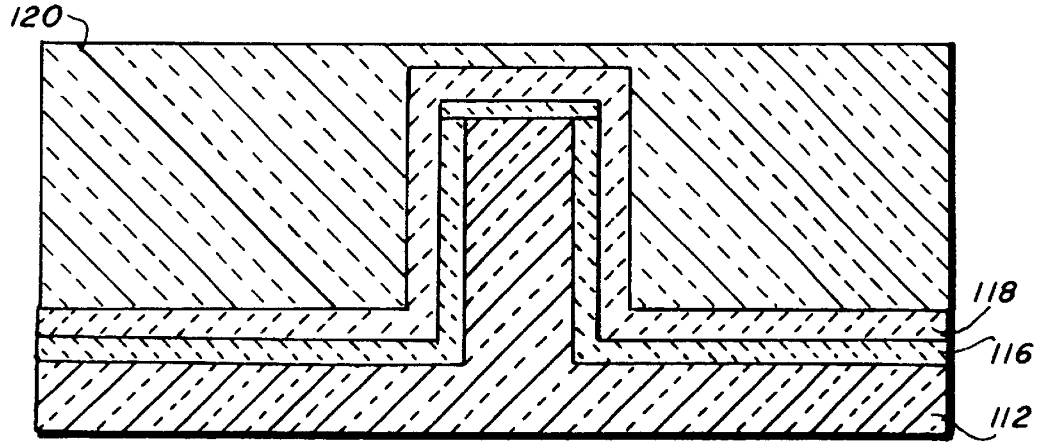
Figure 4G:
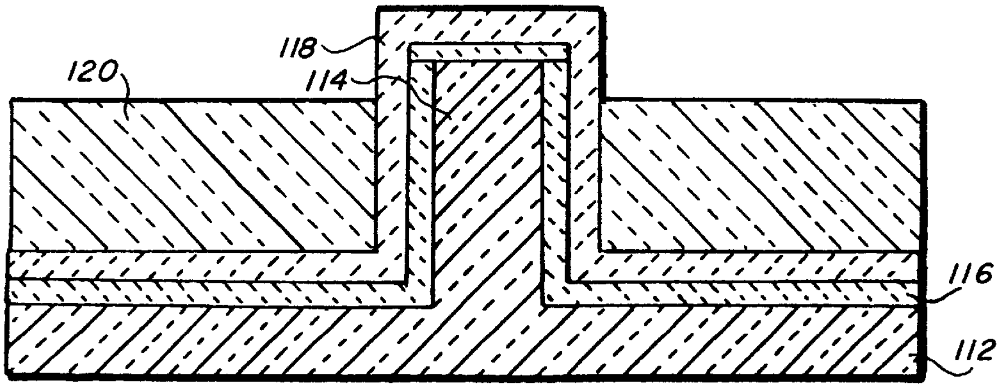

Upper surface 122 of the resulting structure is then planarized by any means, for example, either by etching, sputtering, mechanical polishing, or chemical mechanical polishing, to provide the planarized structure of FIG. 4*f.* Then, the upper portion of insulating layer 120 is preferentially removed (e.g., by chemical etching or RIE) from its planarized upper surface to provide the structure shown in FIG. 4*g,* in which the top of insulating layer 120 is below the top of protrusion 114 and the section of standoff layer 118 covering protrusion 114 is exposed.

Figure 4H:
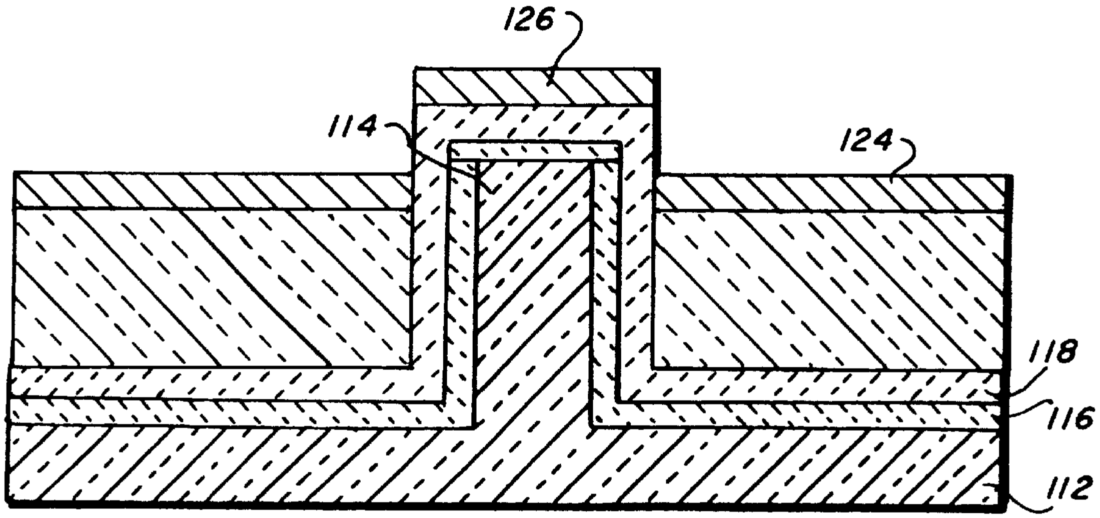
Figure 4I:
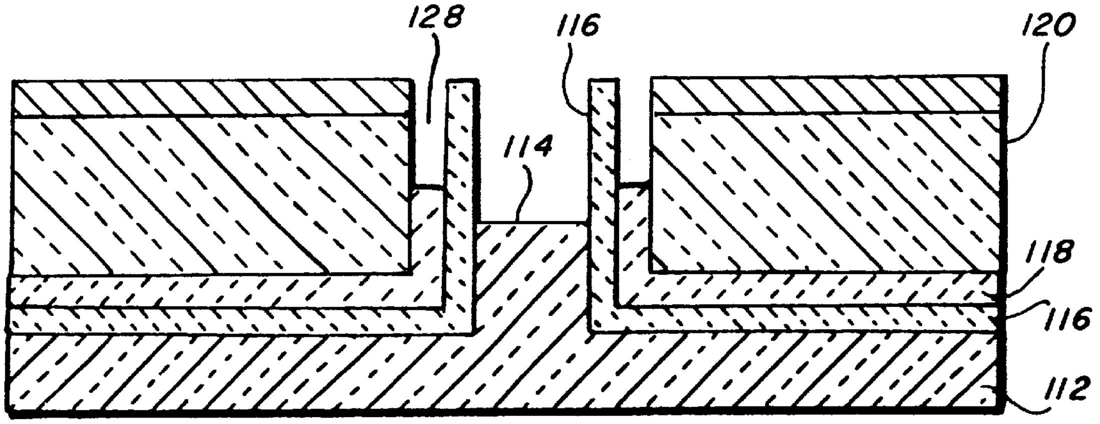

As shown in FIG. 4*h,* gate layer 124 is deposited essentially directionally over insulating layer 120 and the top exposed portion of standoff layer 118, but not appreciably along the sidewalls of standoff layer 118 (If necessary, small amounts of gate layer 124 on the sidewalls of standoff 118 can be removed, for example, by etching for a short time that removes the small amount of gate material on the sidewall but retains a useful thickness of gate material on the horizontal surfaces of insulating layer 120 and the top exposed portion of standoff layer 118). Then, standoff layer 118 is preferentially etched to uncover the upper surface 126 of the portion of emitter layer 116 covering protrusion 114 and to provide a gap 128 (FIG. 4*i*) between insulating layer 120 and the upper portion of the vertical portion of emitter layer 116. This step also removes the portion of gate layer 124 that previously covered that portion 126 of standoff layer 118 and emitter layer 116. Subsequently, the exposed horizontal portion of emitter layer 116 covering protrusion 114 is removed by preferential or directional etching. Then, protrusion 114 is preferentially etched to below the top of the remaining vertical portion of emitter layer 116 to provide the structure shown in FIG. 4*i.*

Having described the invention, the following examples are given to illustrate specific applications of the invention including the best mode now known to perform the invention. These specific examples are not intended to limit the scope of the invention described in this application.

EXAMPLES

I. Starting Hole Structure

The starting hole structure consisted of a 400 nm diameter hole, having a vertical sidewall, which extended downward through a 40 nm Cr layer, a 100 nm heavily doped p-type amorphous silicon layer, a 400 nm thick thermal silicon dioxide, and terminated at about 100 nm deep into an underlying n-type Si(100) substrate. Arrays of lines of 50 holes, spaced at 5 micrometers apart, were fabricated by electron beam lithography in combination with lift-off and reactive ion etching (RIE) methods. Each working sample consisted of three of such array of holes and was cut into 1×1 cm size from 3-inch diameter wafers.

II. Deposition and Etching of the Spacer Layer

A. Chemical Vapor Deposition of the Spacer $SiO_2$ layer.

The spacer silicon dioxide layer was deposited by using low-pressure chemical vapor deposition. The starting working sample was first cleaned to remove contaminants on the surfaces, especially any passivation layers which might have been present on the sidewalls of the holes as a result of reactive ion etching. The sample was placed in a hot-walled quartz reactor tube enclosed in a tube oven. After evacuation, and subsequent heating the reactor to 395–400° C., a mixture consisting of 0.6 Torr diethyl silane, 0.6 Torr $O_2$, and 3 Torr Ar were flowed into the reactor. After 25 minutes of deposition, the gases were shut off. The resulting $SiO_2$ layer on the top horizontal surface was later measured to be about 160 nm thick. However, the deposited $SiO_2$ layer on the sidewall of the hole appeared to be thinner.

B. Etch-back of the $SiO_2$ layer

In a commercial reactive ion etcher, the $SiO_2$ layer was etched away from the top horizontal surface until the Cr metal was exposed. This etching step also removed the $SiO_2$ layer from the bottom of the hole.

II. Fabrication of FEAs With Ru/Li/Ru Thin Film Emitter

A. Deposition Of the Multi-layer Emitter Film

After the reactive ion etching of the CVD $SiO_2$, the sample was mounted on a resistive heater in a reactor and pumped down to a vacuum in the low $10^{-7}$ Torr range. The sample was then preheated to 500° C. for 30 minutes to desorb any contaminants and was cooled to the deposition temperature of 270° C. With the sample surface a few mm away from and directly facing a doser tube, ruthenium carbonyl at a partial pressure of $2\times10^{-6}$ Torr (as measured on the ionization gauge), mixed with $1.8\times10^{-5}$ Torr of $H_2$ gas was dosed onto the sample, for 3.5 minutes. The ruthenium carbonyl precursor was then shut off. The sample was then moved to within a few mm distance from a second doser tube, for Li deposition at the same temperature. Tertiary-butyl lithium, at a partial pressure of $3\times10^{-6}$ Torr (gas pressure indicated on an ionization gauge) was dosed onto the sample for 5 minutes. A second layer of ruthenium was then deposited over the Li (or Li-containing) layer in the same manner as the first Ru layer, except for only 2.5 minutes. The sample was cooled down slowly to room temperature at a rate of about 10 degrees per minute. The total thickness of the Ru/Li/Ru multi-layer film was about 60 nm.

B. Sputtering-Removal of the Emitter Multilayer

After the Ru/Li/Ru emitter film deposition, the sample was placed on a rotating block perpendicular to a 3-cm Kaufman ion gun. A Ne ion beam, at $3\times10^{-4}$ Torr, at a beam current of 10 mA, sputter-removed the Ru/Li/Ru multi-layer film from the top surface—that is until the Cr layer is exposed. At this time the top of the vertical $SiO_2$ spacer layer is also exposed.

C. Recessing the Spacer Layer

The sample was dipped in a 2.5% buffered HF solution for 10 seconds to partially remove the top portion of the vertical $SiO_2$ layer and to undercut part of the original thermal $SiO_2$ insulator layer. The sample was then gently ultrasonicated in distilled water to remove residual HF and any particulates. Finally the sample was dried on a hot plate at 60–80° C. for a few minutes.

The resulting FEA cell, as revealed by SEM analysis, consisted of an emitter with an outer diameter of 250 nm, a emitter film thickness of 60 nm, an emitter-gate separation of 75 nm, and a gate aperture of about 400 nm.

IV. Fabrication of FEAs With Pt/Li/Pt/Li/Pt Emitter Film

The deposition of the Pt/Li/Pt/Li/Pt film and its subsequent sputter-removal and HF treatments are entirely analogous to the processing for the Ru/Li/Ru emitter. The differences were: (1) The $Pt(PF_3)_4$ precursor, at a partial pressure of $3\times10^{-6}$ Torr, was used instead of the ruthenium carbonyl; (2) a deposition temperature of 290° C. was used; (3) 5 alternating layers instead of 3 were deposited; (4) and the corresponding deposition durations were 25 min, 5 min, 40 min, 5 min, and 25 min for Pt, Li, Pt, Li, and Pt, respectively. The total thickness of the multilayer emitter film was about 70 nm.

The sputtering-removal and spacer recessing steps were the same as for the Ru/Li/Ru emitter. The SEM photo of the resulting structure indicated an emitter cell structure consisting of a emitter with a outer diameter of 220 nm, emitter film thickness of 70 nm, an emitter-gate separation of 90 nm and a gate aperture of about 400 nm.

V. Emission Testing

A. Emission From the Ru/Li/Ru Emitters

Figure 5:
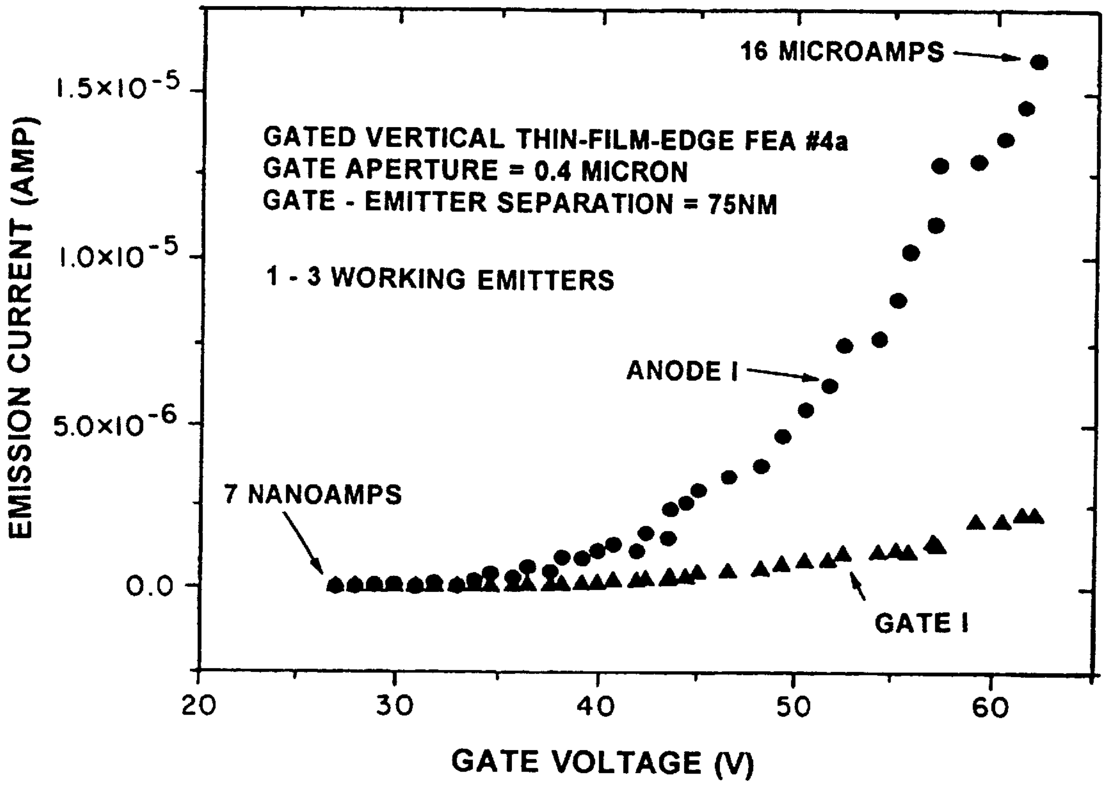
FIG. 5 shows the typical measured current-voltage characteristics of an array of field emitter cell according to the present invention using an Ru/Li/Ru emitters.
Figure 6:
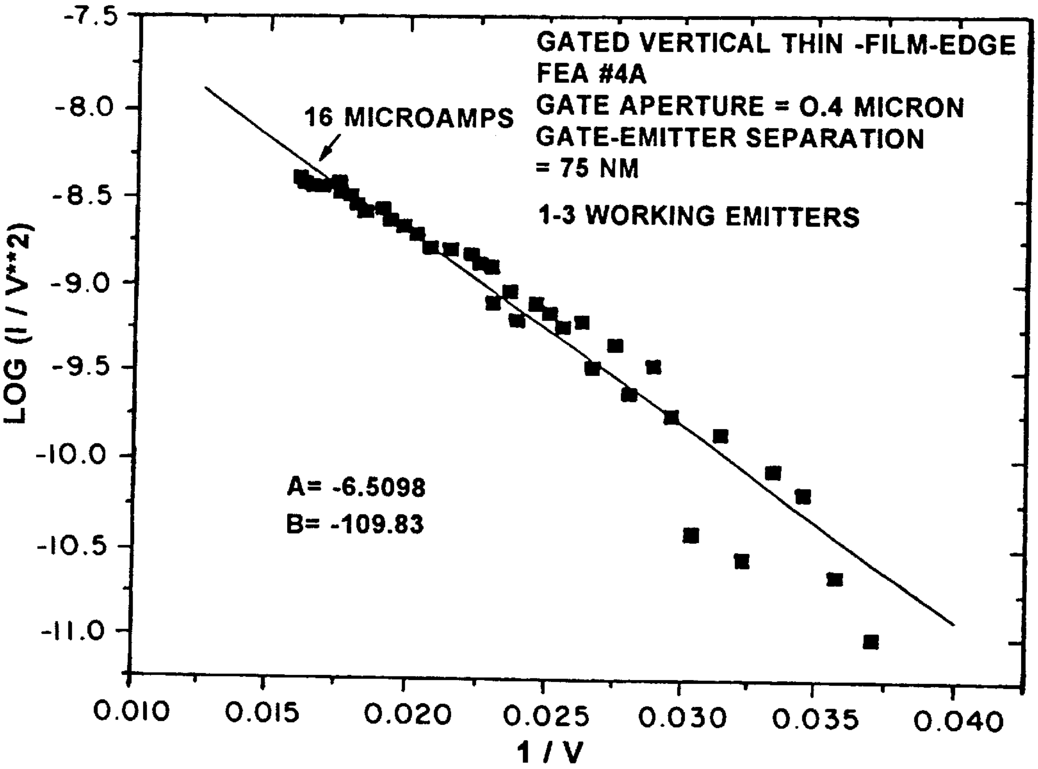
FIG. 6 shows, in Fowler-Nordheim form, a plot of the current-voltage characteristics shown in FIG. 5.

Thin gold wires were silver-epoxied onto the Cr gate metal (on top surface of the sample). The sample was placed into a test-rig, with its top surface at a distance of 2 mm from and parallel to an anode surface of an indium-tin-oxide film on a glass substrate. The back side of the sample, after spot-removal of silicon dioxide, is electrically connected to the thin-film emitter part and is electrically insulated from the gate metal, as well as the anode. With the anode at a constant positive bias of 450V, the backside of the sample grounded through a 1 megaohm resistor to the "Lo" output of a Keithley 237 electrometer, and the gate metal positively biased by the electrometer, the gate voltage was increased to induce field emission. The emission current impinging on the anode was measured by a Keithley 617 electrometer. The gate current was measured with the Keithley 237 electrometer. The measured current-voltage characteristics is shown in FIG. 5 and the corresponding plot in Fowler-Nordheim form is shown in FIG. 6. The latter indicates well-behaved field emission characteristics from these vertical thin-film-edge FEAs. It is believed that there were no more than several working emitter cells (that were turned on), perhaps 1 to 3 emitter cells. The most prominent characteristics were the very low gate turn-on voltage of 27 volts and the very high emission current of 16 microamps at 62 volts. The low turn-on voltage and high emission currents can be attributed to the low work function of Li.

B. Emission from the Pt/Li/Pt/Li/Pt Emitters

Figure 7:
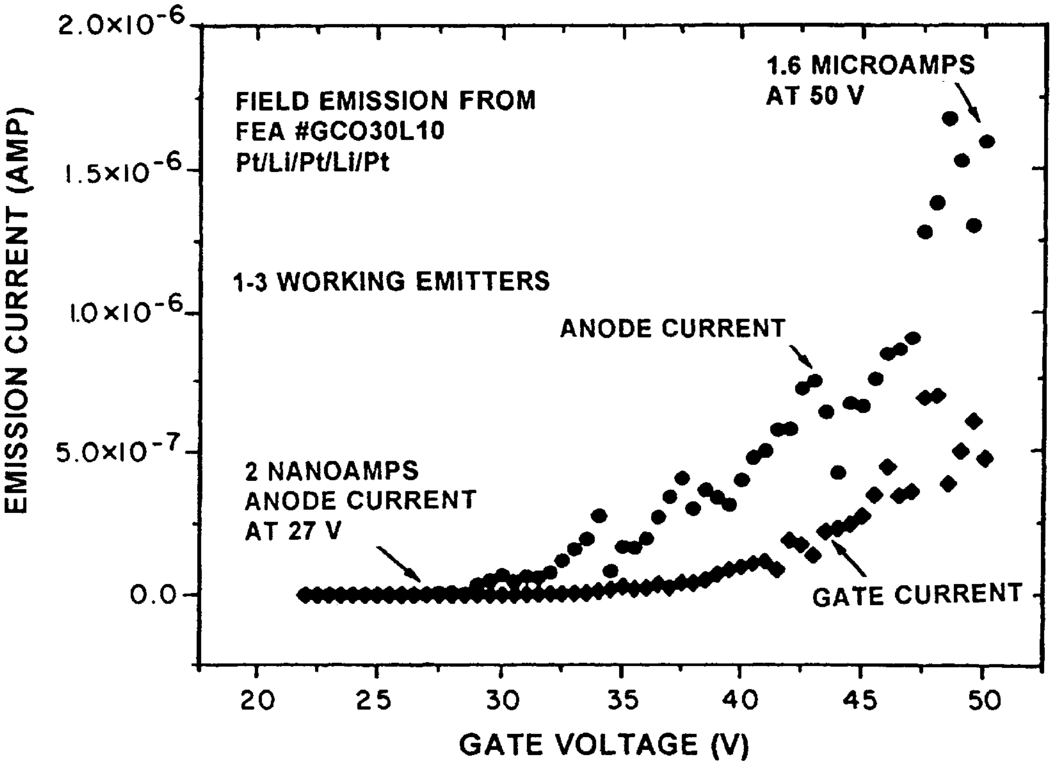
FIG. 7 shows the typical measured current-voltage characteristics of an array of field emitter cell according to the present invention using Pt/Li/Pt/Li/Pt emitters.

Using the same emission test procedure (except that the anode was biased to 600V), field emission were obtained from the Pt/Li/Pt/Li/Pt emitters. A typical current-voltage characteristic is shown in FIG. 7. Again the results indicate a very low gate turn-on voltage of 27 volts and a high emission current of 1.6 microamps at 50 volts. It is believed only 1–3 emitters were working. Again the low turn-on voltage (about the same as in the Ru/Li/Ru case, can be attributed to the low work function of the common Li).

C. Test of Effect of Operation in Leaked Air

With the Pt/Li/Pt/Li/Pt emitter operating at a constant gate voltage of 40V, the emission was monitored over a continuous period of 8100 seconds, with the vacuum chamber ambient cycled alternately between 810-second periods of $5\times10^{-9}$ Torr vacuum and $1\times10^{-6}$ Torr of leaked room air. The results show no apparent degradation of emission due to leaked air. Current-voltage measurements taken after a total of 163 minutes of accumulated time of operation in $1\times10^{-6}$ Torr room air showed no apparent adverse effect in emission—the turn-on voltage remained low, at 27 volts, and a high emission current of 1.5 microamps at 50 volts or 3 microamps at 57 volts. This demonstration showed the efficacy of the noble metal Pt being able to protect the Li emitter element from oxidation, or having Li oxide (which cannot undergo further oxidation) being supported by Pt as a good emitting material.

Obviously, many modifications and variations of the present invention are possible in light of the above teachings. It is therefore to be understood that, within the scope of the appended claims, the invention may be practiced otherwise than as specifically described.

What is claimed is:

1. A field emitter cell comprising:

an electrically conductive substrate layer;

an insulating layer directly upon said electrically conductive substrate layer; said insulating layer having a perforation therethrough, said perforation having at least one essentially vertical sidewall and a bottom surface defined by said electrically conductive substrate layer;

an electrically conductive gate layer directly upon said insulating layer, said electrically conductive gate layer having a second perforation therein, said second perforation being coincident with said underlying first perforation;

an electrically conductive thin film edge emitter, electrically insulated from said gate layer and in electrical contact with said substrate layer, said emitter extending upward from within said first perforation and essentially parallel to said essentially vertical side walls, said emitter having an upper electron-emitting edge in close proximity to said gate layer, said electrically conductive thin film edge emitter forming a shell having said upper electron-emitting edge as an open upper end of said shell; and a standoff (or spacer) layer between and in physical contact with said emitter and said essentially vertical sidewall.

2. The field emitter cell of claim 1, wherein said electrically conductive thin film edge emitter is a single layer including an alloy having a low work function, or is a multilayer structure comprising a layer of a low work function material sandwiched between two layers other than said low work function material.

3. The field emitter cell of claim 2, wherein said emitter is said multilayer structure.

4. The field emitter cell of claim 3, wherein said two layers have a greater resistance to oxidation than said low work function material.

5. The field emitter cell of claim 3, wherein the emitter comprises at least two distinct, contiguous, electrically-conductive layers.

6. The field cell emitter of claim 5, wherein said emitter comprises one or more sublayers selected from the group consisting of a semiconducting sublayer, an insulating sublayer, a resistive sublayer, a metal sublayer, and a superconductive sublayer.

7. The field emitter cell of claim 5, wherein said emitter comprises a layer of Li, Li-containing compounds or Li base alloys sandwiched between two layers of Ru, Ru-containing compounds, or Ru base alloys.

8. The field emitter cell of claim 5, wherein said emitter comprises a layer of Li, Li-containing compounds or Li base alloys sandwiched between two layers of Pt, Pt-containing compounds, or Pt base alloys.

9. The field emitter cell of claim 8, wherein said emitter comprises a Pt/Li/Pt/Li/Pt sandwich.

10. The field emitter cell according to claim 3, wherein said emitter comprises a protective outer layer.

11. The field emitter cell according to claim 10, wherein said protective outer layer comprises diamond.

12. The field emitter cell of claim 2, wherein said two layers have greater mechanical strength than said low work function material.

13. The field emitter cell of claim 2, wherein said low function work material is selected from the group consisting of Li, Li-containing compounds, and Li base alloys.

14. The field emitter cell of claim 1, further comprising a standoff layer between and in physical contact with said emitter and said at least one essentially vertical sidewall, wherein said standoff layer is recessed using selective etching.

15. The field emitter cell of claim 14, wherein said standoff layer is insulating or conducting and is recessed using selective etching.

16. A field emitter cell according to claim 15, wherein said standoff layer serves as a control mechanism for current flow.

17. The field emitter cell of claim 14, wherein said standoff layer is conducting.

18. A field emitter cell according to claim 17, wherein said standoff layer serves as an electron transport medium.

19. A field emitter cell according to claim 17, wherein said standoff layer serves as a heat sink to the emitter.

20. The field emitter cell of claim 1, wherein said emitter has an upper edge that includes sharp points having a tip radius of curvature of less than or equal to about 20 nm.

21. The field emitter cell of claim 20, wherein said emitter is a multilayer structure comprising a layer of low work function material sandwiched between two layers other than said low work function material and said multilayer structure further comprises one or more sublayers selected from the group consisting of a semiconducting sublayer, an insulating sublayer, an electrically resistive sublayer, a metal sublayer, and a superconductive sublayer.

22. The field emitter cell of claim 1, wherein said gate layer is a multilayer structure, said multilayer structure including at least one conducting sublayer.

23. The field emitter cell of claim 1, wherein said gate comprises a p-type semiconductor.

24. The field emitter cell of claim 1, wherein said thin film edge emitter has a resistance that, during emission, limits the emission current of the emitter by causing an IR drop in the potential between the gate and the emitter.

25. The field emitter cell according to claim 1, wherein the perforation of said insulating layer has at least one vertical sidewall.

26. The field emitter cell according to claim 1, wherein said at least one essentially vertical sidewall extends at an angle of about 90 degrees with respect to the substrate.

27. A field emitter cell according to claim 1, wherein said standoff layer provides mechanical support for the emitter.

28. A field emitter cell according to claim 1, wherein said standoff layer defines a predetermined distance between the emitter and the gate.

29. A field emitter cell according to claim 1, wherein said standoff layer extends from said substrate to below an interface of said insulating layer and said gate layer.

* * * * *